US008542539B2

(12) United States Patent
Ghodsi et al.

(10) Patent No.: US 8,542,539 B2
(45) Date of Patent: *Sep. 24, 2013

(54) NAND FLASH MEMORY PROGRAMMING

(75) Inventors: Ramin Ghodsi, Cupertino, CA (US); Qiang Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 57 days.

This patent is subject to a terminal disclaimer.

(21) Appl. No.: 13/189,678

(22) Filed: Jul. 25, 2011

(65) Prior Publication Data

US 2011/0280079 A1    Nov. 17, 2011

Related U.S. Application Data

(63) Continuation of application No. 12/766,343, filed on Apr. 23, 2010, now Pat. No. 7,986,563, which is a continuation of application No. 11/511,038, filed on Aug. 28, 2006, now Pat. No. 7,710,786.

(51) Int. Cl.
  *G11C 11/34* (2006.01)
  *G11C 16/04* (2006.01)

(52) U.S. Cl.
  USPC ............. 365/185.27; 365/185.26; 365/185.18

(58) Field of Classification Search
  USPC ....................... 365/185.01–185.33
  See application file for complete search history.

(56) References Cited

U.S. PATENT DOCUMENTS

| 6,392,929 B1 | 5/2002 | Kim et al. |
| 6,784,480 B2 * | 8/2004 | Bhattacharyya ............... 257/314 |
| 6,891,757 B2 | 5/2005 | Hosono et al. |
| 7,177,197 B2 | 2/2007 | Cernea |
| 7,710,786 B2 * | 5/2010 | Ghodsi et al. ............ 365/185.27 |
| 7,986,563 B2 * | 7/2011 | Ghodsi et al. ............ 365/185.27 |
| 2003/0142548 A1 | 7/2003 | Huang et al. |
| 2004/0164340 A1 | 8/2004 | Arai et al. |
| 2004/0240269 A1 * | 12/2004 | Cernea ...................... 365/185.12 |
| 2005/0057965 A1 * | 3/2005 | Cernea et al. .................. 365/177 |
| 2005/0117399 A1 * | 6/2005 | Kwon et al. ............. 365/185.28 |
| 2008/0049518 A1 | 2/2008 | Ghodsi et al. |
| 2010/0202217 A1 | 8/2010 | Ghodsi et al. |

FOREIGN PATENT DOCUMENTS

| WO | WO-2008027409 A2 | 3/2008 |
| WO | WO-2008027409 A3 | 3/2008 |

* cited by examiner

*Primary Examiner* — Kretelia Graham
(74) *Attorney, Agent, or Firm* — Schwegman, Lundberg & Woessner, P.A.

(57) ABSTRACT

A method of charging a floating gate in a nonvolatile memory cell comprises bringing a substrate channel within the memory cell to a first voltage, bringing a control gate to a programming voltage, and floating the substrate channel voltage while the control gate is at the programming voltage. Memory devices include state machines or controllers operable to perform the described method, and operation of such a state machine, memory device, and information handling system are described.

10 Claims, 5 Drawing Sheets

NAND FLASH MEMORY PROGRAMMING

RELATED APPLICATION

This application is a continuation of U.S. application Ser. No. 12/766,343, filed Apr. 23, 2010 now U.S. Pat. No. 7,986,563, which is a continuation of U.S. application Ser. No. 11/511,038 filed Aug. 28, 2006, now issued as U.S. Pat. No. 7,710,786, both of which are incorporated herein by reference in their entirety.

FIELD OF THE INVENTION

The invention relates generally to electronic memory, and more specifically to programming NAND flash memory.

BACKGROUND

A variety of computer systems and electronic devices use memory that is not volatile, or does not lose its content when power is disconnected. These nonvolatile memories can be reprogrammed, read, and erased electronically, and are particularly well suited to storing information such as music in digital audio players, pictures in digital cameras, and configuration data in cellular telephones. Such memory is commonly known as flash memory, named in part because a flash operation is used to erase the content of a block of data before it is reprogrammed, and is packaged for consumer use in products such as CompactFlash memory cards, USB flash memory drives, and other such devices.

Flash memory comprises a number of cells, each of which typically stores a single binary digit or bit of information. A typical flash memory or nonvolatile memory cell comprises a field effect transistor having an electrically isolated floating gate that controls electrical conduction between source and drain regions of the memory cell. Data is represented by a charge stored on the floating gate, and the resulting conductivity observed between the source and drain regions.

The floating gate resides in an insulating material between a second gate known as a control gate and the channel region of the memory cell. Electrons stored on the floating gate insulated from the control gate and the drain and source by an insulating oxide layer partially cancel out or modify an electric field provided via a voltage signal applied the control gate, resulting in a change in the effective threshold voltage (Vt) of the memory cell. When the memory cell is read by placing a specified voltage on the control gate, the electrical impedance between the source and drain of the device will either allow or not allow current to flow, depending on the presence of a charge on the floating gate and the effective Vt or threshold voltage of the memory cell. The presence or absence of current above a threshold level is sensed, and used to determine the state of the memory cell, resulting in a one or zero value being read.

Memory cells are typically arranged in a two-dimensional array of rows and columns, where the rows are coupled via a wordline conductor and the columns are coupled via a bitline conductor. The wordline and bitline conductors are used during data read and write functions to either select certain wordlines for reading or to select words and bits for writing.

The memory cells themselves are further subject to the resistance and capacitance of the bitlines and wordlines coupled to the memory cell for proper operation and communication with a memory controller. Device features, such as variation in the oxide layer thickness between the floating gate and the conduction region between the source and drain can also cause variation in the threshold voltage and other operating parameters of such a flash memory cell. Also, close physical proximity of memory cells in the memory array can result in coupling between floating gates, further influencing the operation of the memory cells.

For these and other reasons, there is a need for methods and devices to operate and program nonvolatile memory devices.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

One example embodiment of the invention includes a method of charging a floating gate in a nonvolatile memory cell, comprising bringing a substrate channel within the memory cell to a first voltage, bringing a control gate to a programming voltage, and floating the substrate channel voltage while the control gate is at the programming voltage. Memory devices include state machines or controllers operable to perform the described method, and operation of such a state machine, memory device, and information handling system are also described as further example embodiments.

Figure 1:
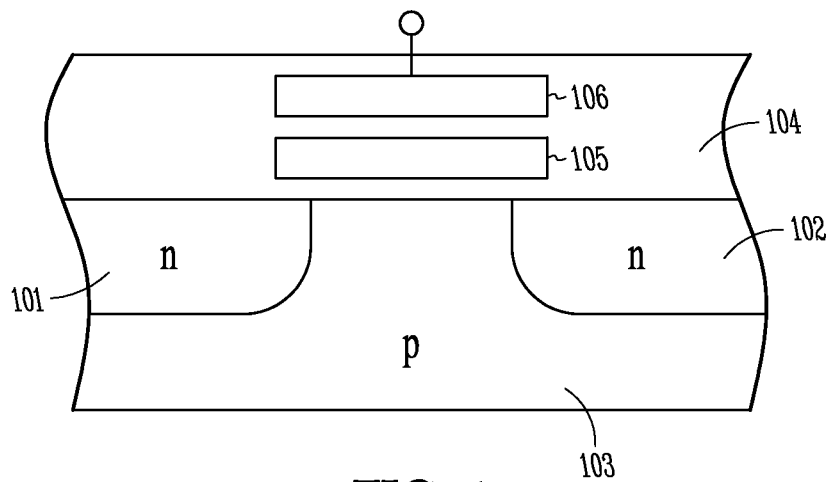
FIG. 1 is a cross-section view of a nonvolatile memory cell, as may be used to practice some embodiments of the invention.

FIG. 1 illustrates an example flash memory or nonvolatile memory cell, which shares a basic structure with an eeprom or electronically erasable programmable memory. A source 101 and drain 102 are formed on a substrate 103, where the substrate is made of a p-type semiconductor material. The source, drain, and substrate are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are added in small, controlled quantities to produce the desired hole or electron concentration in the semiconductor material, resulting in n-type material if a surplus of electrons are present, such as in the source 101 and drain 102, and resulting on p-type material if an excess of holes are present such as in the substrate material 103.

An insulator material such as silicon oxide (SiO2) is used to form an insulating layer 104, which has embedded within it a floating gate 105, fabricated from a conductor such as metal or polysilicon, and a control gate 106 similarly formed of a conductive material. The floating gate is not directly electrically coupled to another conductive element of the memory cell, but is "floating" in the insulating material 104. The floating gate is separated from the region of the p-type substrate material 103 between the source 101 and the drain 102 by a thin insulative layer of controlled thickness, such as one hundred angstroms.

In operation, the floating gate 105 is able to store a charge due to its electrical isolation from other components of the memory cell. Setting or erasing a charge level on the floating gate 105 is performed via a tunneling process known as Fowler-Nordheim tunneling, in which electrons tunnel through the oxide layer separating the floating gate 105 from the substrate 103. Most flash memory cells are categorized as NOR flash or NAND flash, based on the circuitry used to perform write, read, and erase operations.

To write a bit to a NOR flash memory cell or store a charge on its floating gate, the source 101 is grounded and a supply voltage such as six volts is applied to the drain 102. In one embodiment, the drain voltage is applied via a bitline used to identify the bit to be written. A higher voltage such as 12 volts is also placed on the control gate 106, forcing an inversion region to form in the p-type substrate due to the attraction of electrons to the positively charged control gate. The voltage difference between the source and drain in combination with the inversion region in the p-type material result in significant electron flow between the source 101 and drain 102 through the p-type substrate 103's inversion region, such that the kinetic energy of the electrons and the electric field generated by the control gate voltage at 106 result in Fowler-Nordheim tunneling of high-energy or "hot" electrons across the insulator and onto the floating gate 105.

The floating gate thereby adopts a negative charge that counteracts any control gate positive charge's effect on the region of the substrate 103 between the source 101 and drain 102, raising the memory cell's threshold voltage that must be applied to the wordline to result in conduction across an inversion region in the p-type substrate material 103. In other words, when the wordline's voltage is brought to a logic 1 or high voltage such as five volts during a read operation, the cell will not turn on due to the higher threshold voltage as a result of electrons stored on the floating gate 105 during the write operation. The read voltage applied to the control gate is larger than the threshold voltage (Vt) of an erased memory cell, but not large enough to allow conduction across a substrate 103 inversion region of a cell that has been written.

To write a NAND flash memory cell, the source 101 and drain 102 of the memory cell of FIG. 1 are grounded, and the control gate 106 is brought to a higher voltage of perhaps 20 volts. This higher voltage is needed in the absence of "hot" electrons flowing between the source and drain of the memory cell to cause tunneling of electrons from the substrate channel region 103 or the source or drain through the insulator 104 onto the floating gate 105. The electrons that tunnel through the insulating oxide region via the Fowler-Nordheim mechanism result in a negative electric field in the vicinity of the floating gate, and increase the threshold voltage of the transistor formed by the source, drain, and substrate regions.

To erase a memory cell using typical NOR flash memory circuitry, a similar tunneling of electrons takes place from the floating gate to the source 101 or channel 103 of the memory cell. The source is in some embodiments more deeply diffused than the drain to enhance erase performance. A positive voltage such as twelve volts is applied to the source 101, the control gate 106 is grounded, and the drain 102 is left disconnected to perform an erase in one example. The large positive voltage on the source 101 attracts the negatively charged electrons, causing them to tunnel through the insulating layer 104 and leave the floating gate. Because there is very little current flow between the source and drain during an erase operation, performing an erase takes very little current and consumes relatively little power.

In another example of memory cell erase often used in NAND memory configurations, the source 101 and drain 102 are left floating, but the substrate material 103 is brought to a high positive voltage such as 20 volts, attracting the negatively charged electrons and causing them to tunnel from the floating gate 105 through the oxide insulating layer 104 to the substrate material 103. This method is sometimes known as "channel erase", because the channel substrate material 103 receives electrons from the floating gate.

Figure 2:
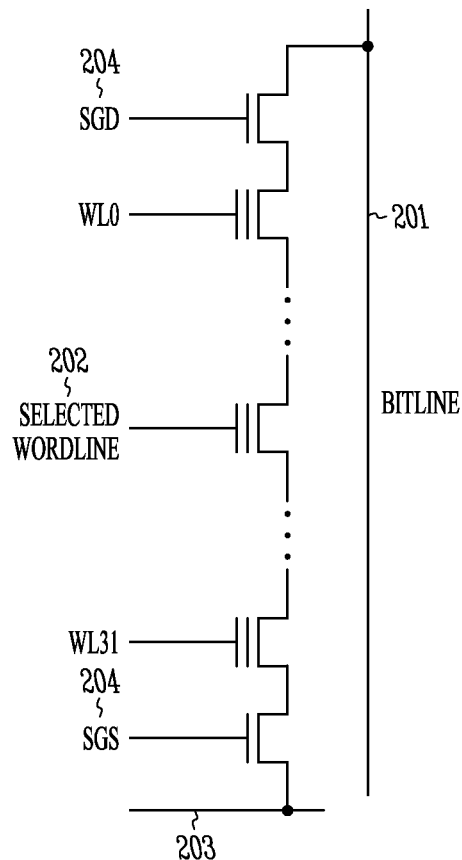
FIG. 2 is a schematic diagram of a string of nonvolatile memory cells in a NAND flash memory configuration, consistent with some example embodiments of the invention.

Memory cells such as that of FIG. 1 are typically arranged in arrays that are addressed via wordlines and bitlines, as shown in FIG. 2. FIG. 2 shows a portion of a NAND flash memory array coupled to a single bitline, where each of the memory cells shown in the bitline is further selectable via a wordline.

The bitline 201 is coupled to a series of floating gate memory cells 202, including in this example memory cells 0-31. The series of memory cells are connected on the other side of the series to source line 203, and can be selectively isolated from the source line 203 and bitline 201 by line select transistors 204.

To perform a read operation, the wordline of the selected memory cell 202 is maintained at a low but positive voltage level while the wordlines of unselected memory cells are brought to a sufficiently high voltage to cause the unselected memory cells to conduct irrespective of any charge that may be on the floating gates of the individual memory cells. If the selected memory cell has an uncharged floating memory gate it will activate as a result of the low positive voltage level on the wordline, but if the floating gate has a negative charge it will raise the threshold voltage of the memory cell 202 above the low positive voltage applied to the control gate such that the cell does not conduct. The state of the memory cell's floating gate can therefore be determined by monitoring conductivity or current flow between the bit line and source line.

To perform a write operation, the bitline 201 is typically grounded and the source line is typically connected to a suitable voltage via line select transistors 204. The gates of source transistors 204 are therefore again coupled to a voltage source such that the transistors conduct. The wordlines of the memory cells not being written are brought to a sufficiently high voltage to cause the memory cells to conduct irrespective of their floating gate charges, such as ten volts, and the substrate channel is coupled to a high voltage such as 8 volts to inhibit programming of unselected memory cells. The selected memory cell 202's wordline is coupled to a significantly higher voltage, such as 20 volts. The voltage applied to the selected memory cell's wordline causes formation of an inversion region in the substrate channel and tunneling of electrons due to the attraction of electrons to the positively charged control gate coupled to the 20 volt signal. The grounded drain in combination with the inversion region in the substrate material provide a continuous source of electrons for tunneling in the memory cell's inversion region, such that electrons that tunnel onto the floating channel can be replaced by electrons from the grounded bitline.

As electrons tunnel through the oxide layer onto the floating gate, the floating gate's initial positive potential due to electric field coupling with the control gate reduces, thereby reducing the voltage difference between the floating gate and the conducting inversion region in the substrate and slowing the tunneling of electrons onto the floating gate. Storage of electrons on the floating gate is therefore somewhat self-limiting, and is defined by factors such as electric field coupling between the control gate and floating gate, oxide thickness, variations in wordline voltage or bitline voltage, and stray electric fields or capacitance with other elements of the memory circuit. The resulting variation in floating gate charge results in variation in threshold voltage Vt of the written memory cells, which is undesirable due to the effect of variation in memory cell reliability and power consumption, as the cell's threshold voltage determines the state of the memory cell and the durability or reliability of the stored data.

The invention seeks in one embodiment to unground the channel during a write operation, such that loss of electrons from the channel as they tunnel into the floating gate will result in a more positively charged channel, providing a further self-limiting influence on the electron charge transferred to the floating gate.

Figure 3:
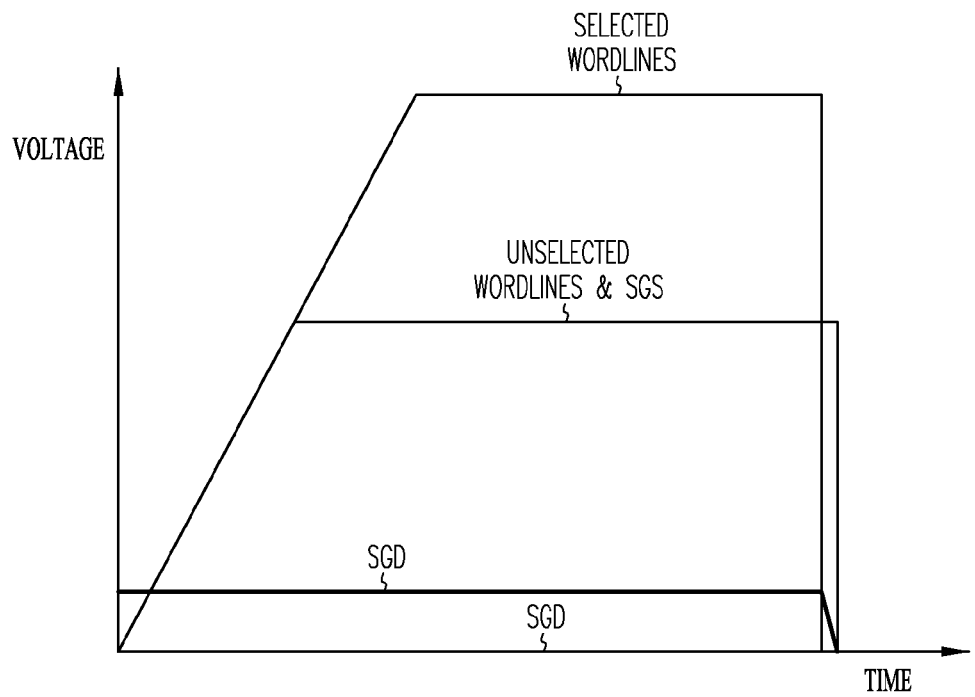
FIG. 3 is a voltage signal timing diagram of a method of programming a nonvolatile flash memory cell, consistent with the prior art.

FIG. 3 shows a voltage timing diagram of various signals applied to the NAND memory cell string of FIG. 2 during a prior art write operation. The SGD transistor 204's gate is here maintained at a voltage sufficient to couple the bitline 201 to the string of memory cells during the write operation, ensuring that the substrate channel in the memory cell remains grounded. The unselected wordlines are maintained at a high enough voltage to cause the memory cell's transistors to conduct irrespective of their programming state, and the SGS line is typically grounded but in an alternate embodiment is brought to a voltage similar to that of the unselected wordline to couple the bottom of the memory cell chain to a grounded source line 203. The high selected wordline voltage of approximately 20 volts is sufficient to cause tunneling of electrons from the grounded substrate onto the floating gate, and the grounded substrate has a constant supply of electrons available via the ground connection.

Figure 4:
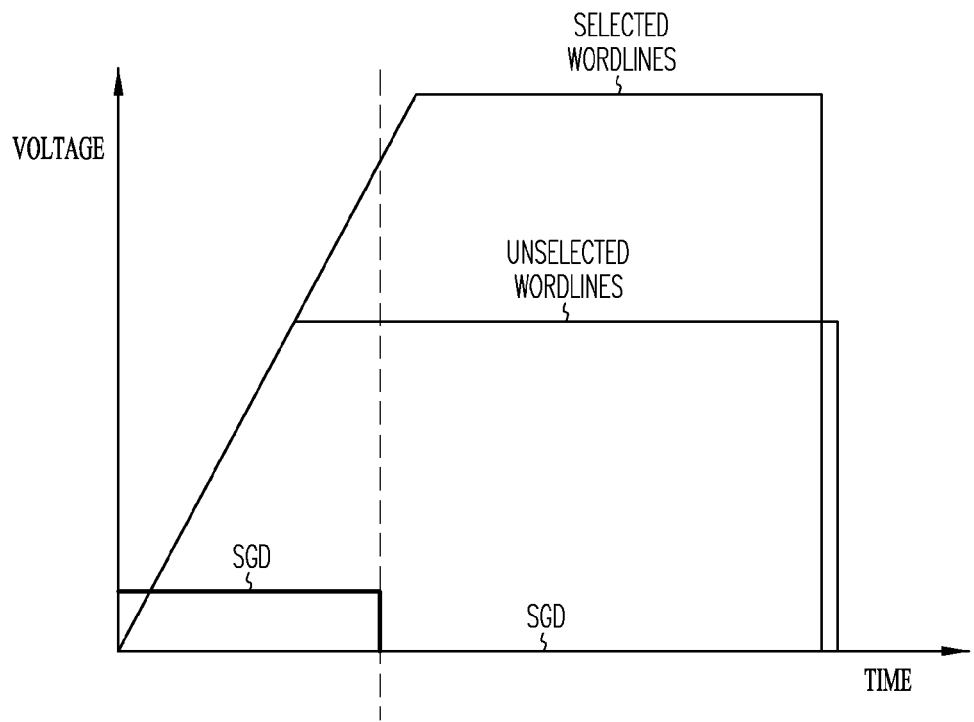
FIG. 4 is a voltage signal timing diagram of a method of programming a nonvolatile flash memory cell, consistent with an example embodiment of the invention.

FIG. 4 illustrates a similar voltage diagram consistent with an example embodiment of the invention in which the SGD transistor conducts only briefly, and is turned off as the selected wordline reaches a sufficient voltage to cause electron tunneling from the substrate channel onto the floating gate, which in one example is approximately 17 volts. Removing a source of replacement electrons from the substrate channel by ungrounding it limits the number of electrons that will tunnel onto the floating gate, as the channel region of the substrate becomes more positively charged as it loses electrons. Further, the previous mechanism of the negative charge migrating to the floating gate causing a reduction in the electric field between the floating gate and the substrate channel by influencing the electric field created by the signal applied to the wordline remains in effect, causing a further self-limiting influence on the programming operation.

In operation, a number of pulses or cycles of the voltage pattern as shown in FIG. 4 will typically be used to program a specific memory cell. The number of pulses needed to program a memory cell may vary in different embodiments based on factors such as whether the substrate channel or the source or drain are coupled to a ground during programming, whether the channel potential rises as electrons are lost, and the degree to which electrons already on the floating gate electrostatically repel other electrons.

In one example, the self-limiting function achieved by floating the substrate channel rather than grounding it during a write operation results in a greater uniformity of threshold voltage change than can be achieved by simply grounding the substrate. The finite resistance and capacitance of the bitlines, wordlines, and source lines, as well as coupling between bitlines, wordlines, and source lines results in less than ideal operation of the memory cells, often causing variations in the charge placed on the memory cell floating gate during a write. This results in variations in the threshold voltage of written memory cells, making their operation less predictable, and making the memory cells more susceptible to interference from source lines, bitlines, and coupling during programming of neighboring memory cells.

Figure 5:
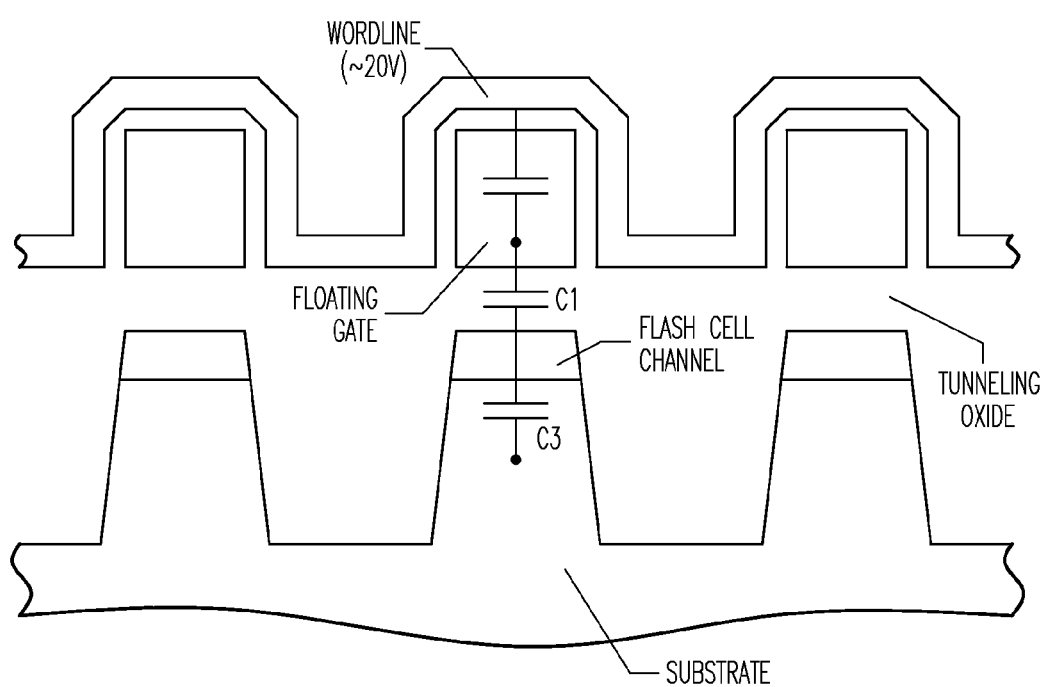
FIG. 5 is a cross-section diagram of a nonvolatile memory cell showing a capacitive model of the memory cell, consistent with some example embodiments of the invention.

Referring to the capacitive memory cell model of FIG. 5, the voltages observed across the tunneling oxide using the prior art programming method and the example method presented in FIG. 4 can be compared. Using conventional programming operation with channel grounded and assuming the initial charge on the floating gate is zero, if $-dQ$ is transferred from channel to the floating gate, then:

$$(Vfg-0V)*C1+(-20V+Vfg)*C2=-dQ$$

$$Vfg-Vch=Vfg=(20V*C2-dQ)/(C1+C2)$$

But, if the programming method of FIG. 4 is adopted, and assuming the initial charge on the floating gate is zero and the initial channel voltage Vch is zero, if $-dQ$ is transferred from channel to the floating gate, then:

$$-(20V-Vfg)*C2+(Vfg-Vch)*C1=-dQ$$

$$(Vch-Vfg)*C1+(Vch-0)*C3=+dQ-20V*C2*C1/(C1+C2)$$

$$Vfg-Vch=[20V*C2*C3-$$

$$dQ*(C2+C3)+20V*C1*C2*C2/(C1+C2)]/(C1*C2+C1*C3+C2*C3)$$

Vfg−Vch is the voltage across the tunneling oxide. If we subtract Vfg−Vch of case 1 from Vfg−Vch of case 2, we can see that:

$$dQ*C2*C2/(C1*C2+C1*C3+C2*C3)/(C1+C2)$$

which means that in programming operation with floating channel, after $-dQ$ is transferred, the voltage across the tunneling oxide is smaller than that in programming with a grounded channel. This proves that floating the channel provides better self-adjustment during programming. More detailed simulation taking into account the coupling capacitors between floating gates, wordlines, and channel has shown that, for a chain of 32 flash cells using a 50 nm technology, the will shrink the Vt distribution or variation between memory cells by ~100 mV out of a Vt distribution of 2V. The normal variation caused by insulating oxide thickness variations or coupling variations between the wordline and floating gate, or between adjacent memory cells, can therefore be reduced. For a chain of 16 cells, the estimated shrink of Vt distribution is ~200 mV out of 2V. In further examples, the channel capacitance can be limited to a greater degree, resulting in an even greater reduction in distribution of threshold voltage Vt between programmed memory cells.

Figure 6:
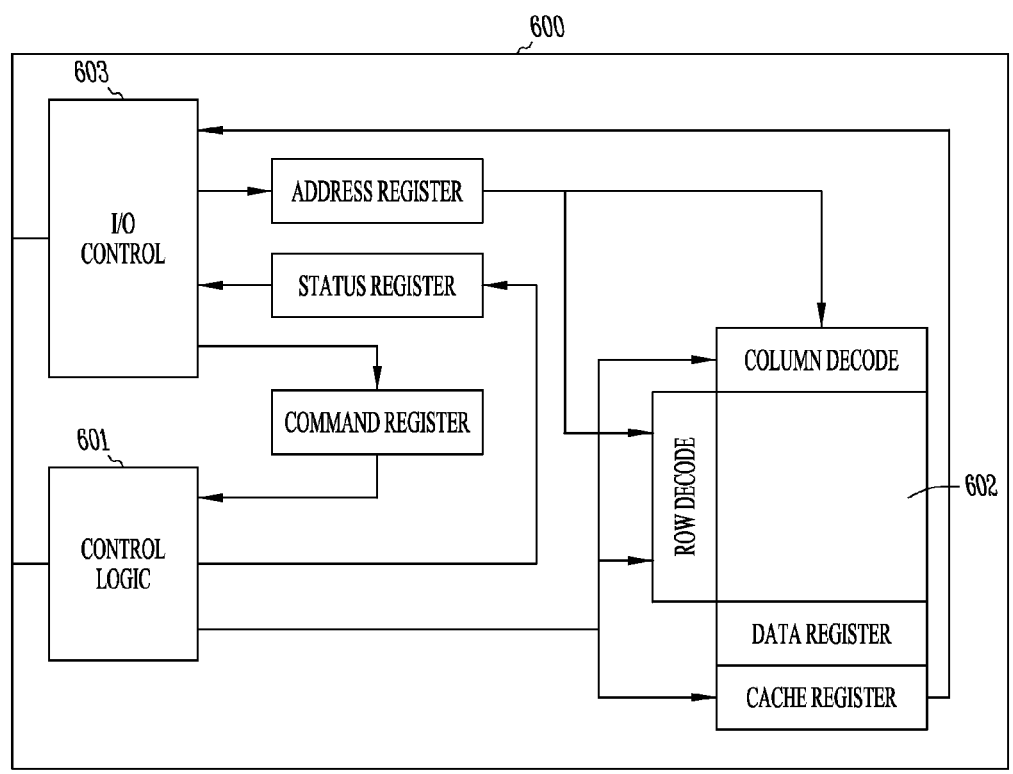
FIG. 6 is a block diagram of a nonvolatile memory device, consistent with some example embodiments of the invention.

The shrink of Vt distribution of 100 mV out of a Vt distribution of 2V means that for 2-bit multi-level NAND flash using multiple threshold levels and multiple bits of storage per memory cell, the 3 sense windows between the 4 states are 100 mV bigger. Reduction in threshold voltage variation will therefore provide a significant benefit in multi-level flash cells, resulting in greater reliability Many flash memory devices also incorporate a flash memory controller or state machine that is operable to perform a write or erase sequence, which relaxes the requirements on the host system or programmer to execute complex or lengthy algorithms to write or erase memory cells. In one example shown in FIG. 6, a nonvolatile memory device 600 includes a state machine or other control logic 601 that receives a command to write or erase one or more memory cells within a flash memory array 602, and cycles through the needed operations or states automatically, freeing up the system issuing the command to perform other functions. In one such example, during a write, the state machine controls write pulse timing to the memory cell, tracks the number of write pulses sent, controls the voltages applied to the memory cell, and verifies that the data was properly written.

When executing an erase, the state machine may first issue writes to all locations within a certain block so that each floating gate contains a uniform charge, and then issues a series of erase pulses to memory cells within the block being erased and monitors the cell status for completion. The state machine further updates a status register indicating that a write or erase cycle is in progress or has been completed, so that I/O controller 603 can transfer data into and out of the memory In one further example, such a state machine is designed to allow the substrate channel of the memory cell to float or remain ungrounded during a significant portion of the programming operation, such as after the wordline voltage reaches a sufficiently high level to cause tunneling of electrons from the substrate channel onto the floating gate. In one example, this is approximately 17 volts, is within a range of 15-20 volts, or is within a range of 10-25 volts. In another example, the substrate is grounded before the write operation begins, but is ungrounded or left floating either before or as the programming voltage is applied to the wordline. The write operation incorporating a floating substrate channel is used in some embodiments to charge all memory cells in a block as part of a block erase, such that the same write routine in the state machine controller can be used for multiple purposes, but in other embodiments will be replaced with a traditional write routine in which the substrate channel remains grounded during the write.

Figure 7:
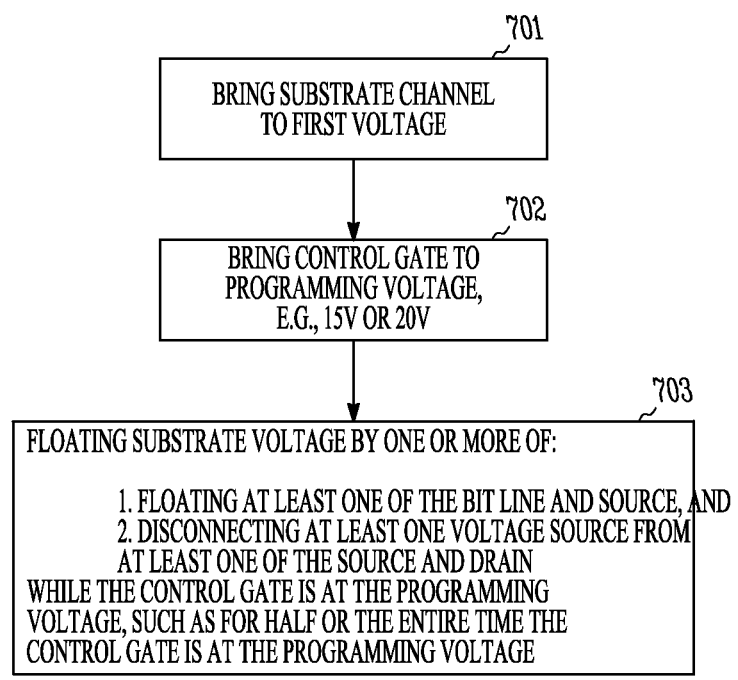
FIG. 7 is a flowchart of a method of programming a nonvolatile memory device, consistent with some example embodiments of the invention.

In a further example shown in FIG. 7, the substrate channel of a flash memory cell is brought to a first voltage at 701. The control gate is brought to a programming voltage such as 15-20 volts at 702, and the substrate voltage is floated. In various examples, floating the substrate comprises floating at least one of the bit line and the source, or disconnecting at least one voltage source from at least one of the source and drain, as shown at 703. Further, the substrate channel is in various embodiments floated for different times, such as for half the time, all the time, or some other fraction of the time at which the control gate is at the programming voltage.

The examples presented here have shown how using a floating substrate channel during a nonvolatile memory cell write operation results in greater programming charge uniformity on the floating gates of programmed memory cells, including application in flash memory cells having multiple charge levels to store more than a bit of information per memory cell. The reduction in cell-to-cell charge variation can result in greater reliability, reduced programming voltages, lower power consumption, higher operating speed, increased information stored per memory cell, and other such benefits depending on the specific implementation.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method comprising:
bringing a channel voltage of a channel of a memory cell to a first voltage;
bringing a control gate of the memory cell to a programming voltage, wherein the programming voltage is higher than the first voltage; and
floating the channel voltage while the control gate is at the programming voltage, wherein bringing the channel voltage to the first voltage comprises coupling at least one of a source or a drain of a string of memory cells including the memory cell to the first voltage, and floating the channel voltage comprises electrically floating voltage on at least one of a source line or a drain line electrically coupled to the channel of the memory cell.

2. The method of claim 1, wherein the first voltage is a ground voltage, and the programming voltage is at least 15 volts.

3. The method of claim 1, wherein floating the channel voltage while the control gate is at the programming voltage comprises floating the channel voltage during at least half of the time the control gate is at the programming voltage.

4. The method of claim 1, wherein the programming voltage is a voltage sufficient to cause electrons to move from a channel of the memory cell to a charge storage structure electrically insulated from the channel and from the control gate.

5. The method of claim 1, wherein floating the channel voltage while the control gate is at the programming voltage comprises floating the channel voltage during the entire time the control gate is at the programming voltage.

6. A method comprising:
applying a programming voltage to a control gate of a memory cell in a programming operation that programs data into the memory cell; and
allowing a channel of the memory cell to float during a portion of the programming operation of the data into the memory cell by electrically floating voltage on at least one of a source line or a drain line electrically coupled to the channel of the memory cell.

7. The method of claim 6, wherein the portion comprises a significant portion of the programming operation.

8. The method of claim 6, wherein allowing the channel of the cell to float during the portion of the programming operation comprises allowing the channel of the cell to float during the portion of the programming operation after the voltage applied to the control gate reaches a level sufficiently high to cause tunneling of electrons from the channel onto a charge storage structure of the memory cell.

9. The method of claim 6, further comprising:
grounding the channel before the programming operation begins.

10. The method of claim 6, wherein allowing a channel of the cell to float during a portion of a programming operation comprises allowing a channel of the cell to float before or as the programming voltage is applied.

* * * * *